(12) United States Patent
Prasad et al.

(10) Patent No.: US 10,354,875 B1
(45) Date of Patent: Jul. 16, 2019

(54) TECHNIQUES FOR IMPROVED REMOVAL OF SACRIFICIAL MASK

(71) Applicant: Varian Semiconductor Equipment Associates, Inc., Gloucester, MA (US)

(72) Inventors: Rajesh Prasad, Lexington, MA (US); Ning Zhan, Scarsdale, NY (US); Tzu-Yu Liu, Somerville, MA (US); James Cournoyer, Rockport, MA (US); Kyu-Ha Shim, Andover, MA (US); Kwangduk Lee, Redwood City, CA (US); John Lee Klocke, Kalispell, MT (US); Eric J. Bergman, Kalispell, MT (US); Terrance Lee, Oakland, CA (US); Harry S. Whitesell, Sunnyvale, CA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 15/947,234

(22) Filed: Apr. 6, 2018

Related U.S. Application Data (60) Provisional application No. 62/614,943, filed on Jan. 8, 2018.

(51) Int. Cl.
H01L 21/033 (2006.01)
H01L 21/3115 (2006.01)
H01L 21/311 (2006.01)

(52) U.S. Cl.
CPC .... H01L 21/0337 (2013.01); H01L 21/31111 (2013.01); H01L 21/31155 (2013.01)

(58) Field of Classification Search
CPC .......... H01L 21/0337; H01L 21/31111; H01L 21/31155
See application file for complete search history.

(56) References Cited

U.S. PATENT DOCUMENTS

| | | |
|---|---|---|
| 2012/0149207 A1 | 6/2012 | Graff |
| 2016/0079034 A1 | 3/2016 | Yieh et al. |
| 2017/0103893 A1 | 4/2017 | Kulshreshtha et al. |
| 2017/0178914 A1 | 6/2017 | Prasad et al. |
| 2018/0090370 A1* | 3/2018 | Hung ................. H01L 21/0332 |
| 2018/0233368 A1* | 8/2018 | Yang .................. H01L 21/2658 |

FOREIGN PATENT DOCUMENTS

| | | |
|---|---|---|
| KR | 10-2016-0002059 A | 1/2016 |
| WO | 2017-202859 A1 | 11/2017 |

OTHER PUBLICATIONS

International Search Report and Written Opinion dated Apr. 18, 2019 for PCT/US2018/066265 filed Dec. 18, 2018.

* cited by examiner

*Primary Examiner* — Nadine G Norton
*Assistant Examiner* — Mahmoud Dahimene (57) ABSTRACT

A method may include forming a sacrificial mask on a device structure, the sacrificial mask comprising a carbon-based material. The method may further include etching memory structures in exposed regions of the sacrificial mask, implanting an etch-enhancing species into the sacrificial mask, and performing a wet etch to selectively remove the sacrificial mask at etch temperature, less than 350° C.

18 Claims, 7 Drawing Sheets

TECHNIQUES FOR IMPROVED REMOVAL OF SACRIFICIAL MASK

RELATED APPLICATIONS

This application claims priority to U.S. Provisional Patent application 62/614,943, filed Jan. 8, 2018, entitled TECHNIQUES FOR IMPROVED REMOVAL OF SACRIFICIAL MASK, and incorporated by reference herein in its entirety.

FIELD

The present embodiments relate to device processing, and more particularly, to removal of sacrificial masks during device processing.

BACKGROUND

In the present day, device fabrication, such as semiconductor device fabrication, may the use of one or multiple sacrificial mask layers, or sacrificial masks, including so-called hard masks. During removal of a mask such as a hard mask, portions of a device may be exposed to a harsh etchant used for mask removal. As an example, during three dimensional NAND memory device (3D NAND) fabrication, a memory array may be exposed to the etchant used to remove hard mask material. While the etchant may be designed to remove the hard mask at a target etch rate using a target recipe, the target recipe may also attack the memory array, resulting in degraded performance of yield. For example, the target recipe may entail high temperature etching effective to remove a carbon-based hard mask. By reducing the etch temperature, attack of the memory by the etchant may be reduced or prevented, while the resulting etch rate of the hardmask may also be reduced below the target etch rate.

With respect to these and other considerations the present disclosure is provided.

BRIEF SUMMARY

In one embodiment, a method may include forming a sacrificial mask on device structure, the sacrificial mask comprising a carbon-based material, etching memory structures in exposed regions of the sacrificial mask, and implanting an etch-enhancing species into the sacrificial mask. The method may further include performing a wet etch to selectively remove the sacrificial mask at an etch temperature, less than 350° C.

In another embodiment, a method may include forming a sacrificial mask on device structure, the sacrificial mask comprising a carbon-based material, and etching memory structures in exposed regions of the sacrificial mask. The method may further include performing a first wet etch to selectively remove a first portion of the sacrificial mask at a first etch temperature, the first etch temperature being 350° C. or less, wherein a second portion of sacrificial mask remains. The method may also include implanting an etch-enhancing species into a remaining portion of the sacrificial mask; and performing a second wet etch to selectively remove the remaining portion of the sacrificial mask at a second etch temperature, the second etch temperature being less than 350° C.

In a further embodiment, a method may include forming a sacrificial mask on device structure, the sacrificial mask comprising a carbon-based material, and etching memory structures in exposed regions of the sacrificial mask. The method may include performing an implant procedure to implant an etch-enhancing species into the sacrificial mask. The implant procedure may involve performing a first implant at a first ion energy; performing a second implant at a second ion energy, greater than the first ion energy, wherein the first ion energy and second ion energy are in the range of 30 keV to 170 keV. The method may also include performing a wet etch to selectively remove the sacrificial mask at an etch temperature, the etch temperature being less than 350° C.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

°In accordance with some embodiments, a novel processing technique entails providing a carbon-based hardmask on a memory structure and implanting the hardmask with etch-enhancing species. The process further involves stripping the hardmask using a dry etchant or wet etchant. In accordance with various embodiments the hardmask may be a boron-carbon material, while the etch-enhancing species include oxygen or hydrogen.

In some embodiments, a carbon-based hardmask is composed of a carbon-boron mixture. In embodiments employing a wet etchant to selectively remove the hardmask, the wet etch chemistry may involve a mixture of sulfuric acid and hydrogen peroxide. Exemplary etch temperatures employing the wet etchant range from 200° C. to 400° C. The embodiments are not limited in this context. In some embodiments, the etch temperature may be between 250° C. and 350° C.

Figure 1:
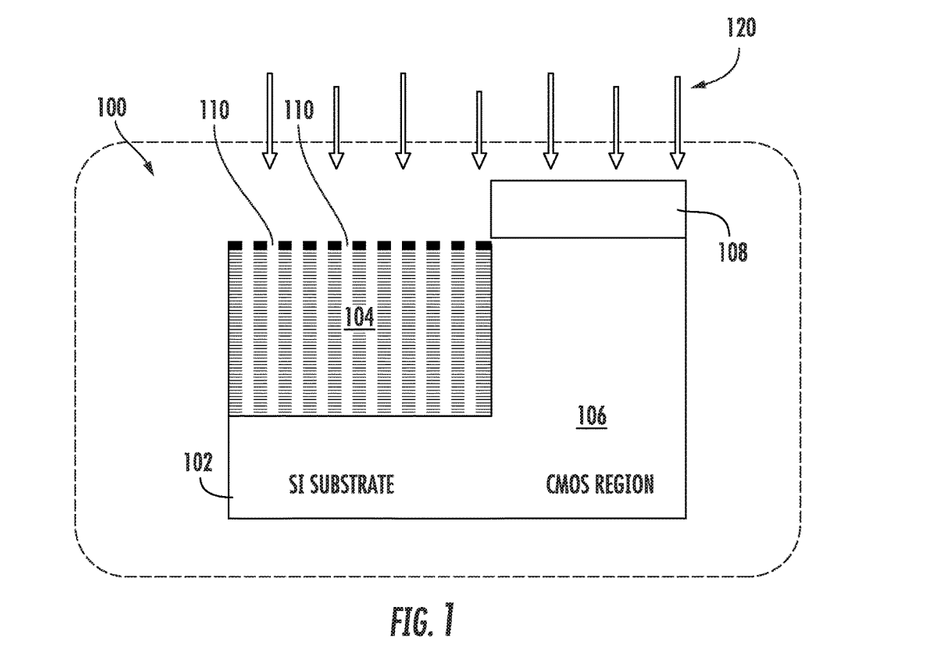
FIG. 1 shows a device arrangement, according to embodiments of the disclosure.

Turning now to FIG. 1, there is shown a device arrangement 100, according to embodiments of the disclosure. The device arrangement 100 may represent a memory device, including a memory area 104 and processor region 106, formed in a substrate 102, such as a silicon substrate. The device arrangement 100 shows a device at a stage of fabrication where openings 110 have been etched into the memory area 104. As such, formation of the openings 110 may take place while the processor region 106 is covered with mask 108. The mask 108 may be a carbon-based hardmask, such as a carbon-boron mixture, to be used as a sacrificial mask, and may be patterned to protect the processor region 106 while the openings 110 are being etched. In the instance depicted in FIG. 1, ions 120 are directed to the substrate 102 and impinge upon the mask 108. In accordance with various embodiments the ions 120 implant into the mask 108, where the ions 120 may represent etch-enhancing species, where such species to enhance the etchability of the mask 108. In particular embodiments, the ions 120 may be oxygen ions or hydrogen ions. After implantation of the ions 120 is complete, the mask 108 may be removed using a suitable etchant, including a wet etchant. By tailoring the conditions of implantation of ions 120, the etching of the mask 108 may be modified to allow selective removal of the mask 108, at a target etch rate, while not damaging the memory area 104.

Figure 2:
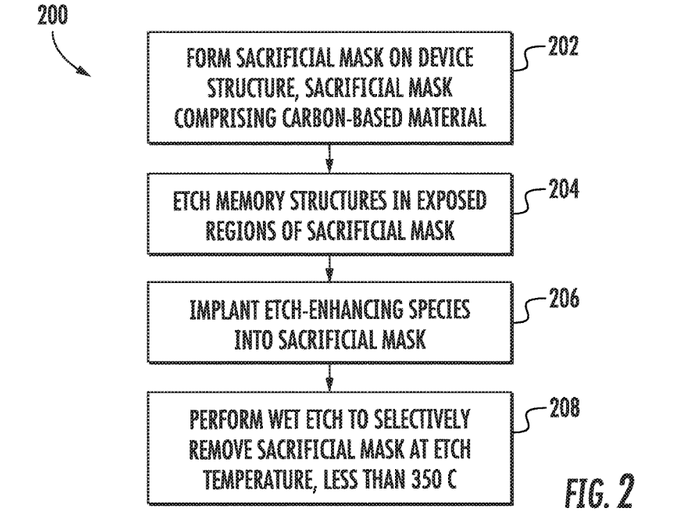
FIG. 2 presents an exemplary process flow, according to embodiments of the disclosure.

Turning now to FIG. 2, there is shown a process flow 200, according to embodiments of the disclosure. At block 202, a sacrificial mask is formed on a device structure, where the sacrificial mask is a carbon-based material. In some examples, the mask may be patterned on the device structure, wherein a plurality of openings are formed on the device structure. In particular embodiments, the plurality of openings may be formed to define exposed regions of the device structure, corresponding to a memory area. Examples of a carbon-based material suitable for the sacrificial mask include a carbon-boron mixture. In some examples, the carbon-boron mixture may have a relative carbon/boron composition (molar ratio) in the range of 90% carbon/10% boron to 30% carbon/70% boron, while the density of the sacrificial mask may be between 1.5-2.2 g/cm$^3$. In some embodiments, the carbon-boron material of the sacrificial mask may additionally include hydrogen. As such, a carbon-boron-hydrogen material used as the sacrificial mask may be in amorphous form according to some embodiments. In some embodiments, the carbon-boron material of the sacrificial mask may additionally include nitrogen. In various embodiments, the sacrificial mask may be formed by a suitable deposition process, such as chemical vapor deposition, plasma enhanced chemical vapor deposition, physical vapor deposition, or other deposition process. The embodiments are not limited in this context. According to various embodiments, the thickness of the sacrificial mask may range between 500 nm and 2000 nm. The embodiments are not limited in this context.

At block 204, a plurality of memory structures are etched into the exposed regions, defined by the openings of the sacrificial mask. The memory structures may be formed by etching holes such as vias or trenches, such as in known memory arrays including NAND structures, such as VNAND. As such, regions of the device structure covered by the sacrificial mask may be protected from the etchant used to etch the memory structures.

At block 206, etch-enhancing species are implanted into the sacrificial mask. Examples of suitable species for etch-enhancing include hydrogen or oxygen ions. The implantation recipe of the etch-enhancing species into the sacrificial mask may be tailored according to the material and the thickness of the sacrificial mask, as well as the etchant recipe to be used for etching the sacrificial mask. Examples of parameters of the implantation recipe include ion species, ion energy, ion dose, and number of implantation procedures to be performed, among other factors.

At block 208, a wet etch is performed to selectively remove the sacrificial mask, such as a sulfuric acid/hydrogen peroxide etch. The etch temperature of the wet etch may be below 350° C., such as down to temperatures as low as 200° C. in some embodiments. The wet etch may be arranged to etch the sacrificial mask at a target etch rate, such as 500 nm/min to 1000 nm/min. The embodiments are not limited in this context. Advantageously, the wet etch rate may be designed to etch the sacrificial mask at a commercially useful etch rate, while not generating defects in the exposed regions of the device structure, such as in a memory area exposed to the wet etch during removal of the sacrificial mask Turning now to FIG. 3, there is shown a process flow 300, according to further embodiments of the disclosure. At block 302, a sacrificial mask is formed on a device structure, where the sacrificial mask is a carbon-based material, as detailed for block 202 above.

Figure 3:
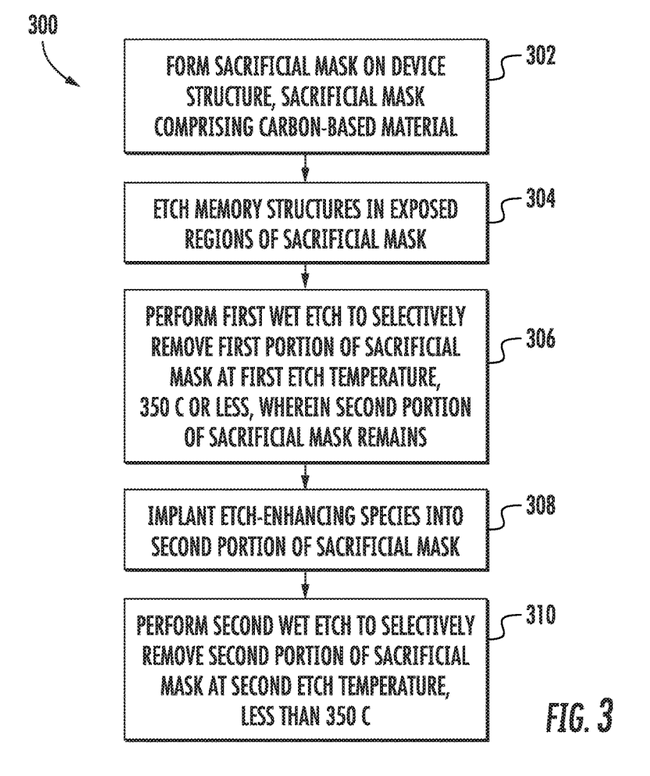
FIG. 3 presents another exemplary process flow, according to further embodiments of the disclosure.

At block 304, a plurality of memory structures are etched into the exposed regions, defined by the openings of the sacrificial mask, as described for block 204 above.

At block 306, a first wet etch is performed to selectively remove a first portion of the sacrificial mask, such as sulfuric acid/hydrogen peroxide etch. The etch temperature of the first wet etch may be at 350° C. or below, such as down to temperatures as low as 200° C. in some embodiments. The wet etch may be arranged to etch the first portion of the sacrificial mask at a target etch rate, such as 500 nm/min to 1000 nm/min. The embodiments are not limited in this context. The first portion of the sacrificial mask may represent 40%-80% of the thickness of the sacrificial mask in some embodiments. In one embodiment where the sacrificial mask has an initial thickness of 1500 nm, the first portion may represent a thickness of 700 nm to 1200 nm. The remaining portion may represent a thickness of 300 nm to 800 nm. The embodiments are not limited in this context.

At block 308, etch-enhancing species are implanted into the second portion of the sacrificial mask. Examples of suitable species for etch-enhancing include hydrogen or oxygen ions. The implantation recipe of the etch-enhancing species into the sacrificial mask may be tailored according to the material and the thickness of the second portion of the sacrificial mask, as well as the etchant recipe to be used for etching the sacrificial mask. Examples of parameters of the implantation recipe include ion species, ion energy, ion dose, and number of implantation procedures to be performed, among other factors. For example, because the second portion of the sacrificial mask is less than the initial thickness, the ion energy, ion dose, or the two parameters may be reduced in comparison to embodiments where etch-enhancing species are implanted into a sacrificial mask having the initial thickness. This approach may serve to lower implantation costs and overall process cost.

At block 310, a second wet etch is performed to selectively remove the second portion of the sacrificial mask, such as sulfuric acid/hydrogen peroxide etch. The etch temperature of the wet etch may be below 350° C., such as down to temperatures as low as 200° C. in some embodiments. The second wet etch may be arranged to etch the sacrificial mask at a target etch rate, such as 500 nm/min to 1000 nm/min. The embodiments are not limited in this context. Advantageously, the first wet and second wet etch may be designed to generate an overall etch rate to etch the sacrificial mask at a commercially useful etch rate, while not generating defects in the exposed regions of the device structure, such as a memory area.

Figure 4A:
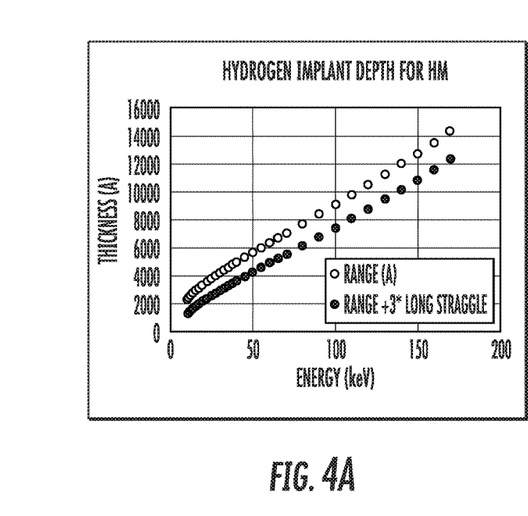
FIG. 4A presents a graph depicting hydrogen implant depth as a function of ion energy for implantation into a carbon-boron layer.

FIG. 4A presents a graph depicting hydrogen implant depth as a function of ion energy for implantation into a carbon-boron layer having a carbon/boron ratio of 40%/60% and a density of 2.1 g/cm$^3$. As illustrated, as implant energy increases to 170 keV, the range increases up to approximately 12000 A (1200 nm), while the straggle (multiplied by 3) increases up to approximately 14500 A. Based upon this behavior a series of implantation procedures were performed for increasing etch rate in a carbon-boron layer using hydrogen ion implantation.

Figure 4B:
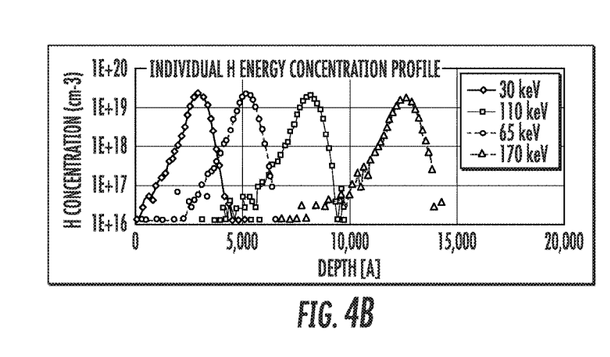
FIG. 4B presents a graph depicting hydrogen implant profiles for four different implant ion energies for implantation into a carbon-boron layer.
Figure 4C:
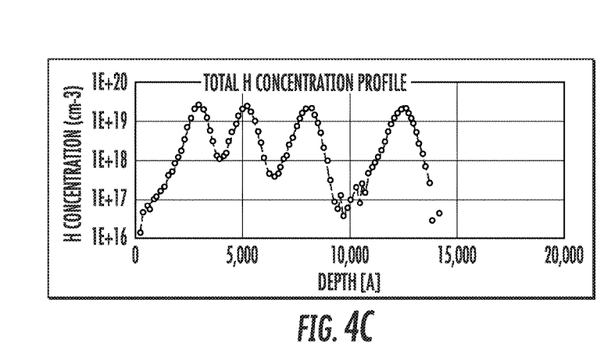
FIG. 4C presents a graph depicting a composite hydrogen implant profile based upon a sum of the implant profiles of FIG. 4B.
Figure 4D:
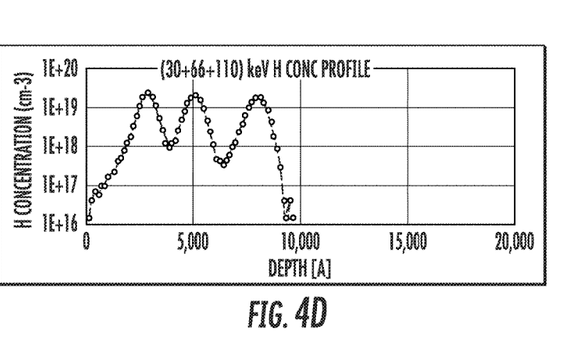
FIG. 4D presents a graph depicting a composite hydrogen implant profile based upon a sum of three implant profiles for three different ion energies.
Figure 4E:
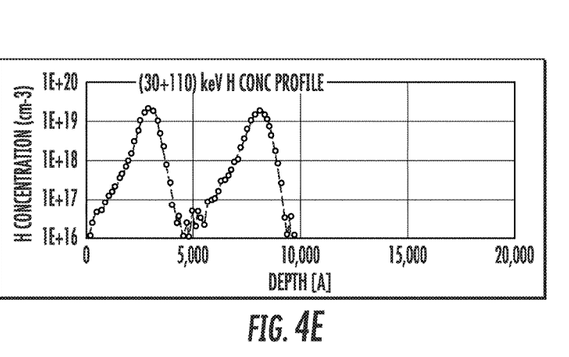
FIG. 4E presents a graph depicting a composite hydrogen implant profile based upon a sum of two implant profiles for two different ion energies.

FIG. 4B presents a graph depicting hydrogen implant profiles for four different implant ion energies for implantation into a carbon-boron layer. The implant profiles all show a peak and a distribution of hydrogen concentration as a function of depth, where the peak increases in depth with increasing ion energy, as shown also in FIG. 4A. FIG. 4C presents a graph depicting a composite hydrogen implant profile based upon a sum of the implant profiles of FIG. 4B. For the four different implant energies shown (35 keV, 60 keV, 110 keV, and 170 keV), the composite implant profile exhibits four distinct peaks in concentration. FIG. 4D presents a graph depicting a composite hydrogen implant profile based upon a sum of the three implant profiles of FIG. 4B. For the three different implant energies shown (35 keV, 60 keV, and 110 keV), the composite implant profile exhibits three distinct peaks in concentration. FIG. 4E presents a graph depicting a composite hydrogen implant profile based upon a sum of the two implant profiles of FIG. 4B. Likewise, for the two different implant energies shown (35 keV, and 110 keV), the composite implant profile exhibits two distinct peaks in concentration.

In one series of etch rate experiments, multiple implantation procedures were performed where a dose of hydrogen ions was implanted into a single 1.5 µm thick carbon-boron layer at energies of 65 keV, 80 keV, 110 keV, and 170 keV in separate implants. Ion dose was 5 E14/cm$^2$ for each implantation procedure. Plasma etching was conducted after implantation to remove a portion of the implanted layer. As compared to an unimplanted layer, the etch rate increased by 44%.

In additional experiments, ion implantation was used to enhance the wet etch rate of a carbon-boron layer. For the data presented in FIGS. 5A-5D, 6, and 7, the etching of the carbon-boron layers proceeded generally as follows: In various experiments, after ion implantation, a boron carbon film of approximately 60% boron, 40% carbon was etched using a solution of 50% (volume) 96% (weight) sulfuric acid and 50% (volume) 30% (weight) hydrogen peroxide. Volumetric flow rate was ~60 ml/min and delivery was in an aerosol form. In particular, a boron-carbon coated silicon wafer was rotated while being heated using UV lamps, to an approximate temperature in the range of 250° C. to 300° C. The time for the chemical delivery, while accompanied by heat, was 150 seconds. This time is the time frame of maximum etching, as no etching will occur in the absence of the chemical etchant, and minimal etching will occur until the wafer supporting the boron-carbon film and chemical have achieved a temperature in excess of 200° C.

Figure 5:
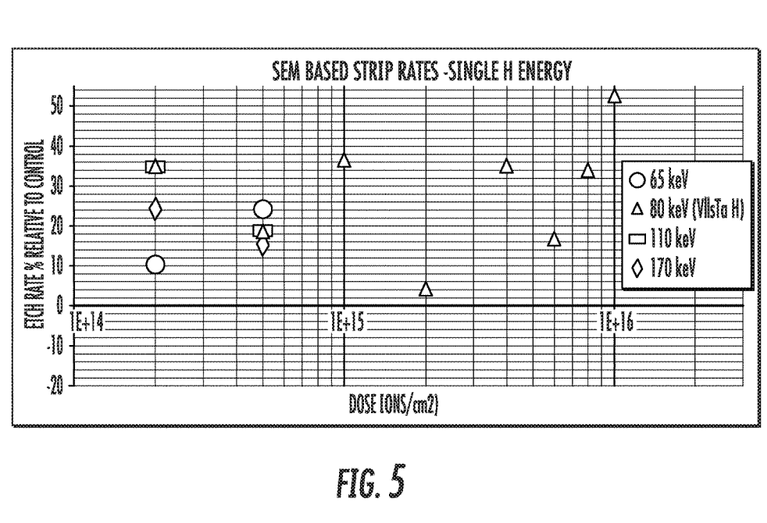
FIG. 5 presents the etch rate of singly-implanted carbon-boron samples as a function of ion dose for different procedures, according to embodiments of the disclosure.

In one series of procedures, a single implantation was performed where hydrogen ions were implanted into a 1.5 µm thick 40% carbon-60% boron layer at energies of 65 keV, 80 keV, 110 keV, and 170 keV. Ion dose was varied between 3 E14/cm$^2$ to 1E16/cm$^2$. FIG. 5 shows the results of the effect of ion implantation dose on wet etch rate, where wet etching was conducted after implantation to remove approximately 700 nm-1000 nm of the implanted layer. The data (and the data of FIGS. 5A-6) is based upon SEM measurements and is plotted as etch rate enhancement (etch rate increase with respect to an unimplanted layer) as a function of ion dose on a semilog scale. As compared to an unimplanted layer, the etch rate increased in the range of 10% to 50%. For ion dose in the range of 2E14/cm$^2$ to 5 E14/cm$^2$ an etch rate enhancement was observed of approximately 10% to 35%, with no clear energy dependence of etch rate. For 80 keV ion implantation, ion dose was varied between 1 E15/cm$^2$ and 1E16/cm$^2$, yielding increases post-implantation etch rate of 35% up to 50%, the latter result for 1E16/cm$^2$ dose.

Figure 6A:
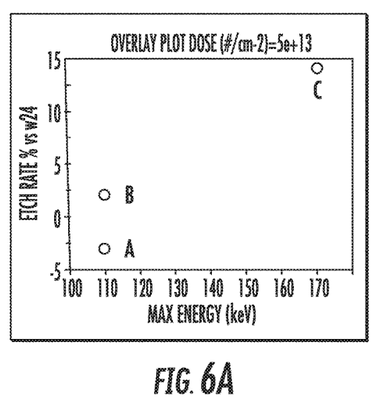
FIG. 6A, FIG. 6B, FIG. 6C, and FIG. 6D present the results of etch rate enhancement of an implanted carbon-boron layer as a function of ion energy for different ion doses, in accordance with embodiments of the disclosure.
Figure 6B:
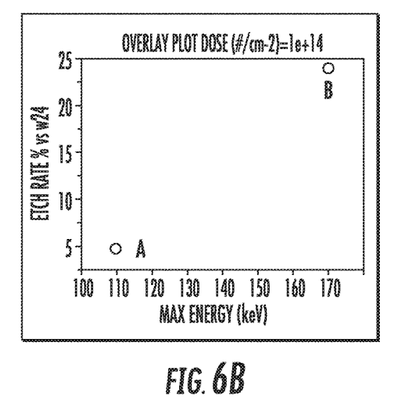
Figure 6C:
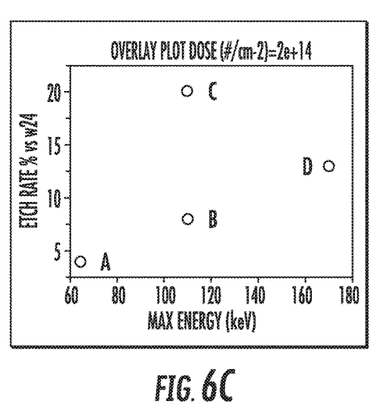

FIG. 6A, FIG. 6B, FIG. 6C, and FIG. 6D present the results of wet etch rate enhancement (etch rate increase with respect to unimplanted carbon-boron layers) as a function of ion energy for different ion doses for a 40% carbon/60% boron layer. The key for the experimental conditions used to produce the sample data for these figures is shown in table I. In FIG. 6A for a given implant, the ion dose is 5 E13/cm$^2$, in FIG. 6B the ion dose is 1E14/cm$^2$, in FIG. 6C the ion dose is 2E14/cm$^2$, and in FIG. 6D the ion dose is 5E14/cm$^2$. In many of the samples, multiple implants were performed, as listed in table I. The data in FIGS. 6A-6D is plotted for the highest energy implant used to implant a given sample. For example, sample A of FIG. 6A is implanted twice at 5 E13/cm$^2$ for a given implant, where one implant energy is 30 keV, while the highest implant energy (for the other implant) is 110 keV, for a total implant dose of 1 E14/cm$^2$. In FIG. 6B, for sample A, three different implants are performed, where a given implant introduces an ion dose of 1 E14/cm$^2$ for a total ion dose of 3 E14/cm$^2$, where the highest implant energy is 110 keV. The sample B for FIG. 6B uses the same implants as sample A, with an additional implant at 170 keV, for a total dose of 4 E14/cm$^2$. In FIG. 6C, the samples were implanted with just one implant, save for sample B, where three different implants, at 2 E14/cm$^2$ ion dose in a given implant, were performed. The samples in FIG. 6D were implanted with just one dose at 1 E14/cm$^2$ for the given ion energies shown.

Figure 6D:
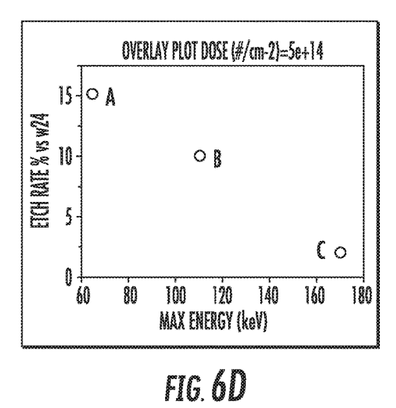

While much of the data of FIGS. 6A-6C presents the results of multiple implants, some general trends may be discerned. At relatively lower single of total implant dose values, the etch rate increases after ion implantation, with etch rate enhancement generally increasing with increasing ion energy up to 170 keV. Notably, as shown in FIG. 6D, at 5E14/cm$^2$ ion dose, implanted in just one implant, the etch rate enhancement with respect to unimplanted samples decreases with increasing ion energy up to 170 keV. Accordingly, from the results of FIGS. 6A-6D, a combination of implants at different ion energies may be useful to enhance the etch rate of an implanted carbon-boron layer. The etch rate is stated as a percentage change of the etch rate of the implanted sample relative to an unimplanted sample.

TABLE I

Key to sample conditions in FIGS. 6A-6D

|   | energy | dose | etch rate enhancement (%) |
|---|---|---|---|
| FIG. 6A samples | | | |
| A | 30, 110 | each at 5e13 | -3 |
| B | 30, 65, 110 | each at 5e13 | 2 |
| C | 30, 65, 110, 170 | each at 5e13 | 14 |
| FIG. 6B samples | | | |
| A | 30, 65, 110 | each at 1e14 | 5 |
| B | 30, 65, 110, 170 | each at 1e14 | 24 |
| FIG. 6C samples | | | |
| A | 65 | each at 2e14 | 4 |
| B | 30, 65, 110 | each at 2e14 | 8 |
| C | 110 | each at 2e14 | 20 |
| D | 170 | each at 2e14 | 13 |
| FIG. 6D samples | | | |
| A | 65 | 5.00E+14 | 15 |
| B | 110 | 5.00E+14 | 10 |
| C | 170 | 5.00E+14 | 2 |

In another series of examples, multiple hydrogen implantations were performed for a given carbon-boron layer sample, where the ion energy was varied between implantations into the given sample. The ion energy for a given implantation was 30 keV, 65 keV, 110 keV, or 170 keV. For example, a two-implantation procedure involved implantation at 30 keV and 110 keV, a three-implantation procedure involved implantation at 30 keV, 65 keV, and 110 keV, while a four-implantation procedure involved implantation at 30 keV, 65 keV, and 110 keV, and 170 keV.

Figure 7:
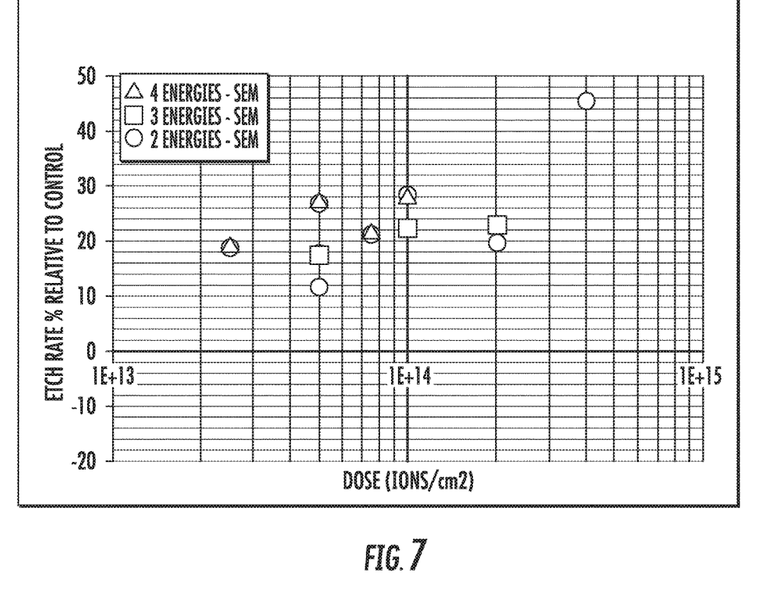
FIG. 7 presents the etch rate of multiply-implanted carbon-boron samples as a function of ion dose for different procedures, according to embodiments of the disclosure.

After the multiple implantations were performed into a given carbon-boron sample, a wet etch was performed using a sulfuric acid/hydrogen peroxide mixture as described above at 250° C.-300° C. FIG. 7 is a graph presenting the etch rate of multiply-implanted 40% carbon-60% boron samples as a function of ion dose (on a semilog scale) for different procedures. The etch rate is expressed as a relative increase in etch rate with respect to an unimplanted carbon-boron sample. The x-axis plots ion dose per implant procedure, where a given ion dose is repeatedly implanted at different ion energies, described in the preceding paragraph. Thus, total ion dose may be determined by multiplying the value on the x-axis by the number of implants (energies) for a given data point. As shown, the etch rate is substantially increased in all implanted samples, while generally increasing with ion dose up to the highest dose measured, 4 E14/cm$^2$. As an example, for a two-implantation procedure, at 4 e14/cm$^2$ dose (for each of two different procedures, meaning a total dose of 8 e14/cm$^2$), the relative etch rate is increased 45% with respect to an unimplanted sample. In this particular example, one implantation was performed at 30 keV and ion dose of 4e14/cm$^2$ and another implantation was performed at 110 keV with ion dose also at 4e14/cm$^2$.

In summary, implantation of a sacrificial mask, such as a carbon-boron mask, using an appropriate ion, may yield an increase in etch rate of the sacrificial mask in the range of 30%-50% for etchants including plasma etching, as well as wet etchants. As an example, these results enable an effective sacrificial mask etch rate in the range of 800 nm/min to 1000 nm/min for sulfuric acid/hydrogen peroxide mixture at etch temperatures of 350° C. or less, wherein damage to exposed regions of a device, such as memory areas, is prevented or reduced during removal of the sacrificial mask.

Figure 8:
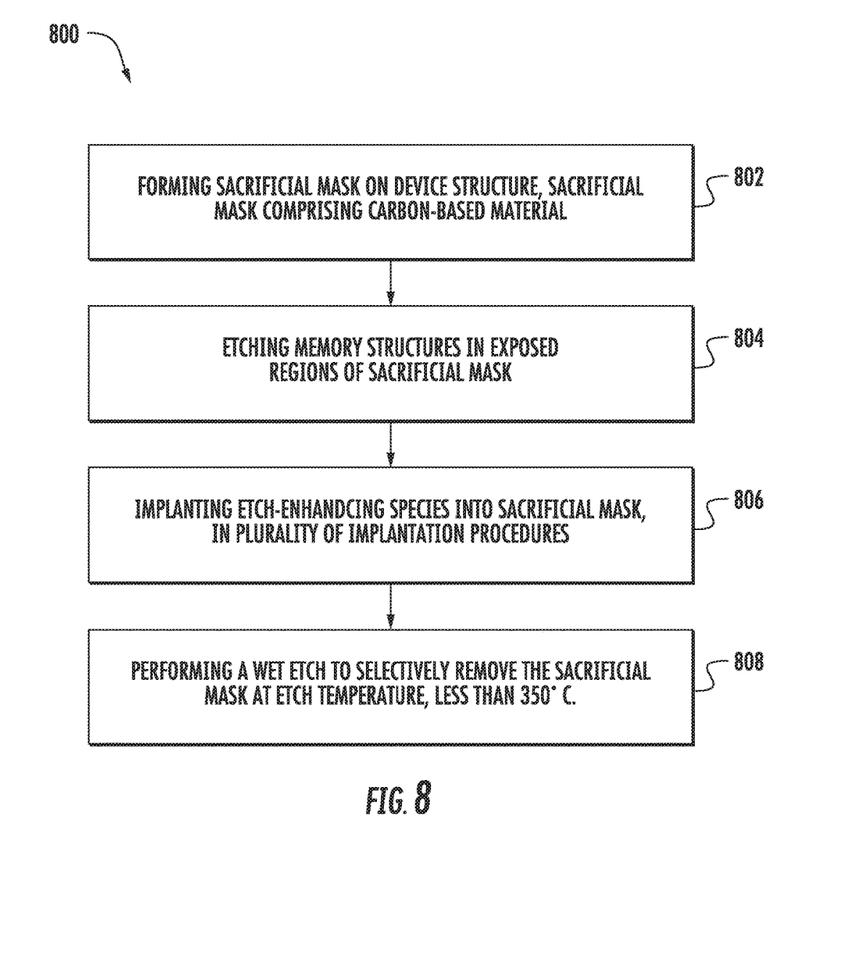
FIG. 8 shows an exemplary process flow according to embodiments of the disclosure.

FIG. 8 presents an exemplary process flow 800 according to embodiments of the disclosure. At block 802, a sacrificial mask is formed on a device structure, where the sacrificial mask is a carbon-based material.

At block 804, etching of memory structures in exposed regions of the sacrificial mask is performed.

At block 806, an etch-enhancing species is implanted into the sacrificial mask, in a plurality of implantation procedures. Examples of suitable species for etch-enhancing include hydrogen or oxygen ions. The implantation recipe of the etch-enhancing species into the sacrificial mask may be tailored according to the material and the thickness of the sacrificial mask, as well as the etchant recipe to be used for etching the sacrificial mask. Examples of parameters of the implantation recipe include ion species, ion energy, ion dose, and number of implantation procedures to be performed, among other factors. For example, the ion energy may be varied between different implantation procedures, to generate an implant profile to optimize etch rate enhancement for removing the sacrificial mask.

At block 808 a wet etch is performed to selectively remove the sacrificial mask at an etch temperature, less than 350° C.

In sum, the present embodiments provide the advantages of the ability to reduce damage to exposed regions of a device during removal of a sacrificial mask, while providing the additional advantage of achieving a target etch rate using commercially viable processes, such as wet etching. Another advantage provided by the present embodiments is the ability to substantially increase etch rate of a sacrificial mask while maintaining ion dose at an adequately low dose to achieving a low-cost implantation process per substrate.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method, comprising:
   forming a sacrificial mask on device structure, the sacrificial mask comprising a carbon-based material;
   etching memory structures in exposed regions of the sacrificial mask;
   implanting an etch-enhancing species into the sacrificial mask; and
   performing a wet etch to selectively remove the sacrificial mask at an etch temperature, less than 350° C.

2. The method of claim 1, the etch-enhancing species comprising hydrogen.

3. The method of claim 1, the wet etch comprising a sulfuric acid/hydrogen peroxide mixture.

4. The method of claim 1, the implanting comprising implanting a dose of hydrogen ions of between 4 E13/cm$^2$ and 1E15/cm$^2$.

5. The method of claim 4, the implanting comprising implanting the dose of hydrogen ions in a plurality of implant procedures, wherein a first implant procedure comprises a first ion energy, and a second implant procedure comprises a second ion energy, lower than the first ion energy.

6. The method of claim 1, wherein the sacrificial mask comprises an initial thickness of 1000 nm to 1500 nm.

7. The method of claim 1, wherein the etch temperature is between 250° C. and 300° C.

8. The method of claim 1, wherein the sacrificial mask comprises a carbon/boron mixture having a molar ratio of 90% carbon/10% boron to 30% carbon/70% boron.

9. The method of claim 8, wherein the sacrificial mask further comprises hydrogen.

10. The method of claim 1, wherein the implanting comprising implanting at least one dose of hydrogen ions at an ion energy between 30 keV and 170 keV.

11. A method, comprising:
    forming a sacrificial mask on device structure, the sacrificial mask comprising a carbon-based material;
    etching memory structures in exposed regions of the sacrificial mask;
    performing a first wet etch to selectively remove a first portion of the sacrificial mask at a first etch temperature, the first etch temperature being 350° C. or less, wherein a second portion of sacrificial mask remains;
    implanting an etch-enhancing species into a remaining portion of the sacrificial mask; and
    performing a second wet etch to selectively remove the remaining portion of the sacrificial mask at a second etch temperature, the second etch temperature being less than 350° C.

12. The method of claim 11, the second temperature being between 250° C. and 300° C.

13. The method of claim 11, wherein the sacrificial mask comprises a carbon/boron mixture having a molar ratio of 90% carbon/10% boron to 30% carbon/70% boron.

14. The method of claim 11, wherein the sacrificial mask further comprises hydrogen.

15. The method of claim 11, wherein the first portion of the sacrificial mask comprises 40%-80% of an initial thickness of the sacrificial mask.

16. A method, comprising:
    forming a sacrificial mask on device structure, the sacrificial mask comprising a carbon-based material;
    etching memory structures in exposed regions of the sacrificial mask;
    performing an implant procedure to implant an etch-enhancing species into the sacrificial mask, the implant procedure comprising:
      performing a first implant at a first ion energy; and
      performing a second implant at a second ion energy, greater than the first ion energy, wherein the first ion energy and second ion energy are in a range of 30 keV to 170 keV; and
    performing a wet etch to selectively remove the sacrificial mask at an etch temperature, the etch temperature being less than 350° C.

17. The method of claim 16, wherein the sacrificial mask comprises an initial thickness of 1000 nm to 1500 nm.

18. The method of claim 16, wherein the implant procedure comprises a total ion dose of between 5 E13/cm$^2$ and 1E16/cm$^2$.

* * * * *